United States Patent [19]
Meitner et al.

[11] Patent Number: 5,329,556
[45] Date of Patent: Jul. 12, 1994

[54] REPRODUCTION EQUIPMENT FOR DIGITAL AUDIO

[76] Inventors: Edmund Meitner, 4637 Mac Leod Tr. S.W., Calgary/Alberta, Canada; Howard Burman, 6344 Hamilton, Montreal, Quebec, Canada, H4E 3C4

[21] Appl. No.: 62,698

[22] Filed: May 14, 1993

Related U.S. Application Data
[63] Continuation of Ser. No. 687,584, Apr. 4, 1991.

[51] Int. Cl.⁵ .............................................. H04L 7/00
[52] U.S. Cl. ..................................... 375/106; 375/118
[58] Field of Search .................. 375/106, 118; 341/144

[56] References Cited
U.S. PATENT DOCUMENTS
5,103,467  4/1992  Bedlek et al. ................... 375/118

Primary Examiner—Tesfaldet Bocure

[57] ABSTRACT

Re-synchronization of digital audio signals before converting the signals from digital to analog form using a stable clock reduces uncertainties in the timing of the audio signal.

11 Claims, 4 Drawing Sheets

REPRODUCTION EQUIPMENT FOR DIGITAL AUDIO

This application is a continuation of application Ser. No. 07/687,584, filed on Apr. 4, 1991.

PRIOR ART

Since introduction of digital audio it was recognized that despite early expectations the recovery of analog signals from their digital representation is not as perfect as was projected. Soon it was recognized, that in the decoding process a jitter can occur which would cause distortions not acceptable to the audiophile. Early means to overcome some of the problems and their causes were purely mechanical. However, in addition to the jitter caused by the methods of decoding and the use of the coding formats, typical distortions were found which were entirely caused by the design of electronic components, such as inadequate power supply decoupling and on-chip power distribution.

BACKGROUND OF THE INVENTION

The present invention relates to digital audio reproduction equipment. Since the introduction of digital audio equipment in the early eighties, critical listeners have often complained of an undefined "harshness" and "uncertainty" in the upper treble region of the sound reproduced by digital audio equipment. The source for the "harshness" was determined to be the result of an uncertainty in the start and stop of a) the timing signal, the 'work clock' of the digital-to-analog converter, (DAC), and b) the data bits in the serial digital interface to equipment external to the reproduction equipment.

In the industry this type of timing uncertainty is known as "Phase Jitter" of digital signals and in many other applications it is of no concern. The source of this unwanted jitter was determined to be:

a) mechanical resonance of the compact disc (CD) itself, defects of the CD such as drop-outs, disc eccentricity, and errors in focus and tracking;

b) a basic design problem of large scale integrated (LSI) circuits used in the equipment to process digital signals.

The mechanical resonance is an inherent characteristic of the CD; a typical CD has a self-resonant frequency in the midrange of human hearing at about 850 Hz. The resonance is of a very high "Q", i.e. the resonance bandwidth is very narrow. The resonance occurs when sonic energy in the range of the resonant frequency is reproduced in the vicinity of the CD player. The acoustic feedback causes the disc to vibrate at its resonant frequency. The vibration of the CD induces the focus servo of the optical read head to continuously refocus, and thereby demanding extra power from the power supply to perform the refocusing operation. Thus the focus servo modulates the output of the power supply, thereby causing unwanted electrical reactions by other electronic components of the CD player.

The industry has addressed this problem and reduced the harshness caused by the resonant frequency of the CD by introducing fly-wheel weights and damping devices to be placed on the CD during operation. Such a procedure changes the vibration of the disc and changes the recognized 'harshness' and 'uncertainty'. However, changing the mechanical response characteristic of the CD does not solve the problem, it reduces only one source of the distorting signals, the acoustic feedback via a vibrating CD.

DESCRIPTION OF THE INVENTION

It was discovered that the master oscillator generating the 'system clock' of the CD player electronic is sensitive to changes in the power supply voltage. The master oscillator is part of the function block known as Serial Data Formatter and embedded in the Large Scale integrated (LSI) component known as Serial Data Formatter. It was discovered that the clock output signal 'XSYS' of the Serial Data Formatter showed a modulation synchronous with the operation of the focus servo. That is, the acoustic feedback caused a modulation of clock signal 'XSYS'. The other cause for the phase jitter was found to be the data dependent power drain of the LSI components. Power demands of LSI components change with the data to be processed and the state changes occurring during processing. Thus the output of the power supply for the electronic components is modulated by the recorded program material of the CD. As mentioned above a change in the power supply current in turn causes a change in the external and internal supply voltages of the LSI components. Such changes of the supply voltage of electronic components or logic sections of electronic components also shift logic thresholds of binary logic function elements, thereby producing phase jitters. FIG. 3 is an illustration of the timewise shift of logic level '1' and '0' thresholds with a change in the voltage of the current supply. While this failure modes were observed first in combination with CD equipment, they are not limited to CD equipment. Especially the second failure mode was observed in other equipment performing digital audio signal processing, such a digital audio tape equipment, laser disk equipment, digital filters etc.

The circuitries of the present invention solve the problem at the root by providing a system clock frequency which is independent from the current load of the common power supply, and by re-clocking digital data before they are supplied to the DAC and to external equipment.

SHORT DESCRIPTION OF THE DRAWINGS

DESCRIPTION OF A FIRST PREFERRED EMBODIMENT

Figure 1:
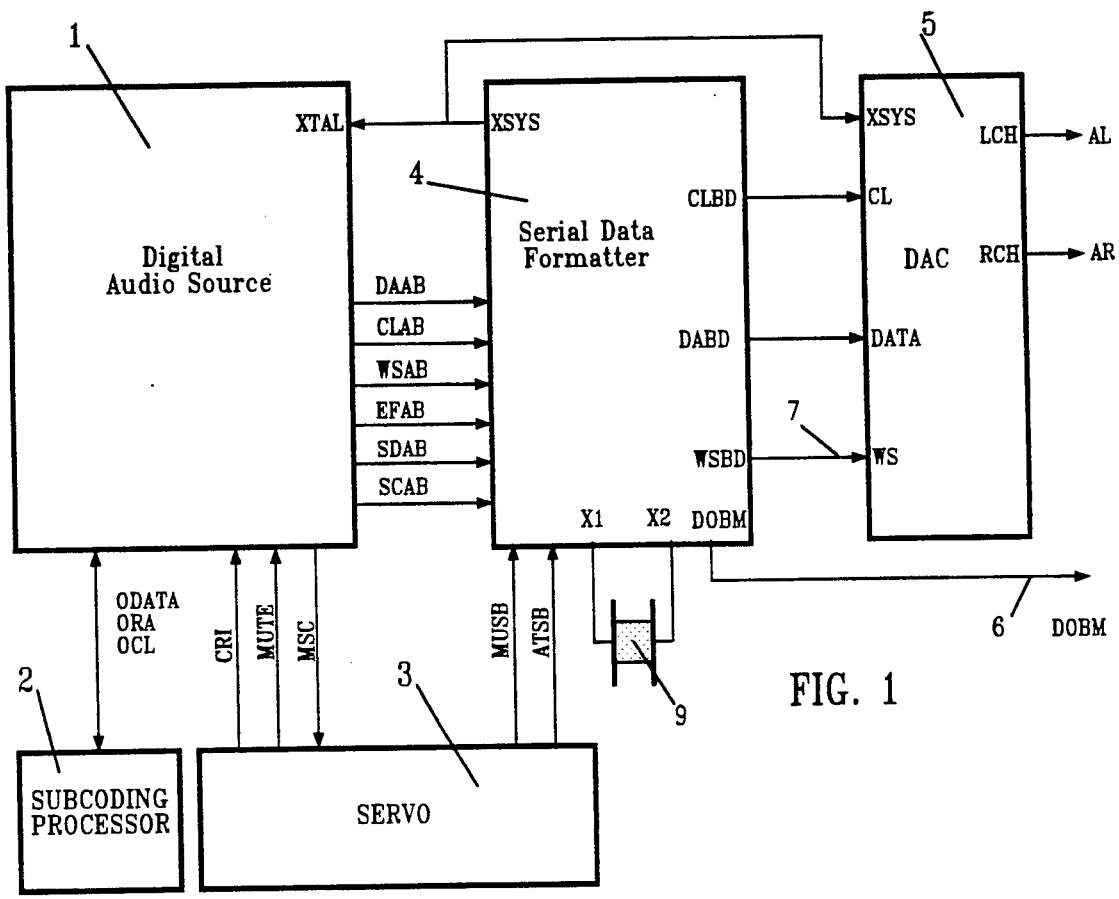
FIG. 1 is a schematic illustration of the interconnection of major components involved in the reproduction of audio signals from a local digital audio source.

FIG. 1 is a simplified schematic illustration of the basic components of a digital audio playback unit. The digital signals are provided by digital audio source 1, such as a compact disk player, a digital audio tape player, or a similar source of digital audio signals. A subcoding processor 2 performs some processing of the digital audio signals before they are send to serial data formatter 4 via a bus consisting of:
I²S bus signals: DAAB, CLAB, and WSAB,
Error Flag EFAB, and
Subcoding data and clock signals: SDAB, and SCAB.
This bus is well-known and is not effected by the invention. The mechanical drive of the audio source 1 is controlled via servo 3. Operating clock for digital audio source 1 is supplied by serial data formatter 4, which derives the required clock from crystal 9 connected to terminals X1 and X2 of Formatter 4. Serial data formatter 4 generates a serial digital signal which can be processed by the digital-to-analog converter (DAC) 5 or a peripheral device attached to serial output line DOBM 6. DAC 5 interfaces with formatter 4 via 4 signals:
XSYS System Clock.
CLBD Clock
DABD Digital Data
WSBD Word Select 7.
Of these interface signals only the source of the XSYS System Clock and the word select interconnection 7 to DAC 5 are effected by the present invention. DAC 5 generates left and right channel audio signals AL and AR.

In one wellkonwn application the functions of the major components are performed by micro-circuits as follows:

| Device | Ref. # | Circuit Type |
|---|---|---|
| Digital audio source and digital filter | 1 | SAA7310 |
| Serial Data Formatter | 4 | SAA7220 |
| Digital-to-analog Converter | 5 | TDA1541 |
| Subcoding Processor | 2 | microprocessor |
| Servo | 3 | microprocessor |

The above list of components is but one combination of components which perform the transformation of digital audio signals into linear audio signals. Other component sets exhibit different partitionings for the functions required to transform a digital audio signal into a linear audio signal, they may include additional functions. The description of the invention is based on the set listed above. The invention is applicable on other sets of components because it does not require a specific method or implementation of the various functions, but overcomes a deficiency common to many integrated circuit components.

The interconnections between the various components are conventional, documented by the manufacturers of these components, well-known to the person skilled in the art and no detailed description of the operation is necessary, except for those functions relating to the present invention.

Figure 3:
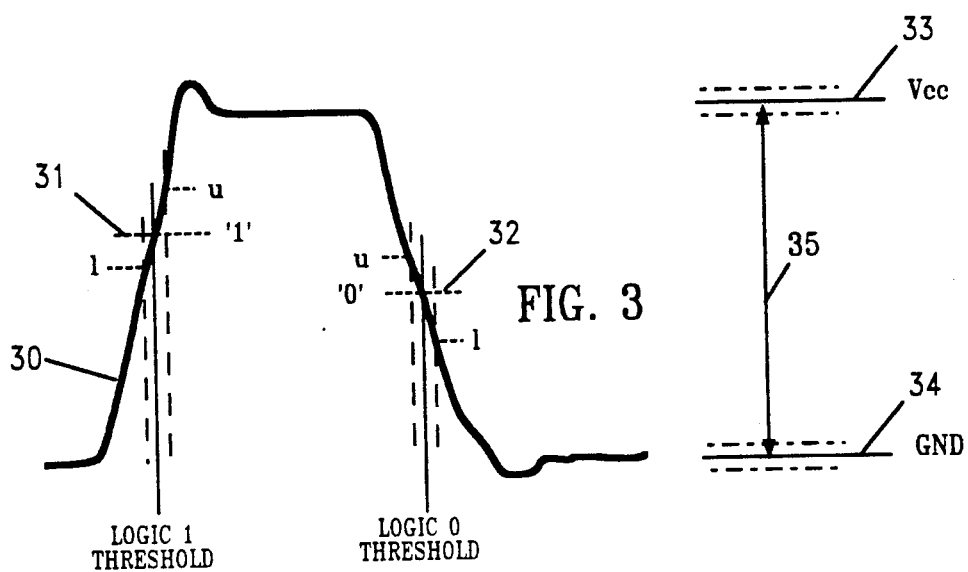
FIG. 3 is an illustration of the shift of thresholds for logic '1' and logic '0' of a binary signal.

It was discovered that the distortions causing a harshness in the generated audio signal is caused by a shift in the threshold levels for logic levels '0' and '1' of the digital audio signal. FIG. 3 is an illustration for this behavior. Curve 30 represents a digital signal rising from a low level to a high level and returning to a low level. While rising to the high level corresponding to a logic '1' level the signal level passes threshold 31. A signal level above threshold 31 is considered a logic '1' signal. When returning to the low level the digital signal 30 passes threshold 32. Any signal below threshold 32 is considered a logic '0' signal. Thresholds 31 and 32 are not at the same value, and neither threshold has a fixed value but varies within certain limits from component to component and with changes in the supply voltage as indicated by the dashed lines next to letters u and l. Lined u designating upper allowed threshold levels, lines l designating lower allowed threshold levels.

There are three causes for a change in the supply voltage: first, the external power source may output a voltage which exhibits variations dependent on the current drawn from this power supply, second, the current supply interconnection between the power source and the electronic circuit may exhibit a significant resistance, resulting in a voltage drop depending on the current, third, the power return interconnection from the electronic circuit to the power source may exhibit a significant resistance, resulting in another voltage drop depending on the current.

In FIG. 3 the possible change f the supply voltage Vcc is indicated by lines 33, whereby the solid line indicates specified supply voltage. Lines 34 indicate the possible change of the GND reference voltage. Threshold voltages 31 and 32 are dependent on the voltage difference 35 between supply voltage 33 and reference voltage 34. Any change in the either Vcc voltage 33 or GND voltage 34 or both will result in a change of threshold levels 31 and 32.

FIG. 3 illustrates how a change in the threshold level transforms into a variation of the signal length. Reducing the threshold levels lengthens a logic '1' signal: signal 30 passing through threshold 31 causes a logic '1' level at earlier time instant than expected, signal 30 passing through threshold 32 causes a logic '0' level signal at a later time instant than expected. In the same manner raising the threshold levels reduces the length of a logic '1' signal. If a signal controls directly or indirecty by its change to another signal level the time at which a certain linear signal is generated, then that linear signal is timewise distorted.

The present invention provides means to overcome the influence of the supply voltage on critical timing components.

It has been determined that the clock signal controlling the transmission of the Word Select signal 7 from serial formatter 4 to DAC 5, and the digital data output signal DOBM 6 are most effected. Furthermore it was determined that the oscillator of serial formatter 4 driven by crystal 9 outputs a frequency modulated by the power consumption of some section of serial formatter 4.

Figure 2:
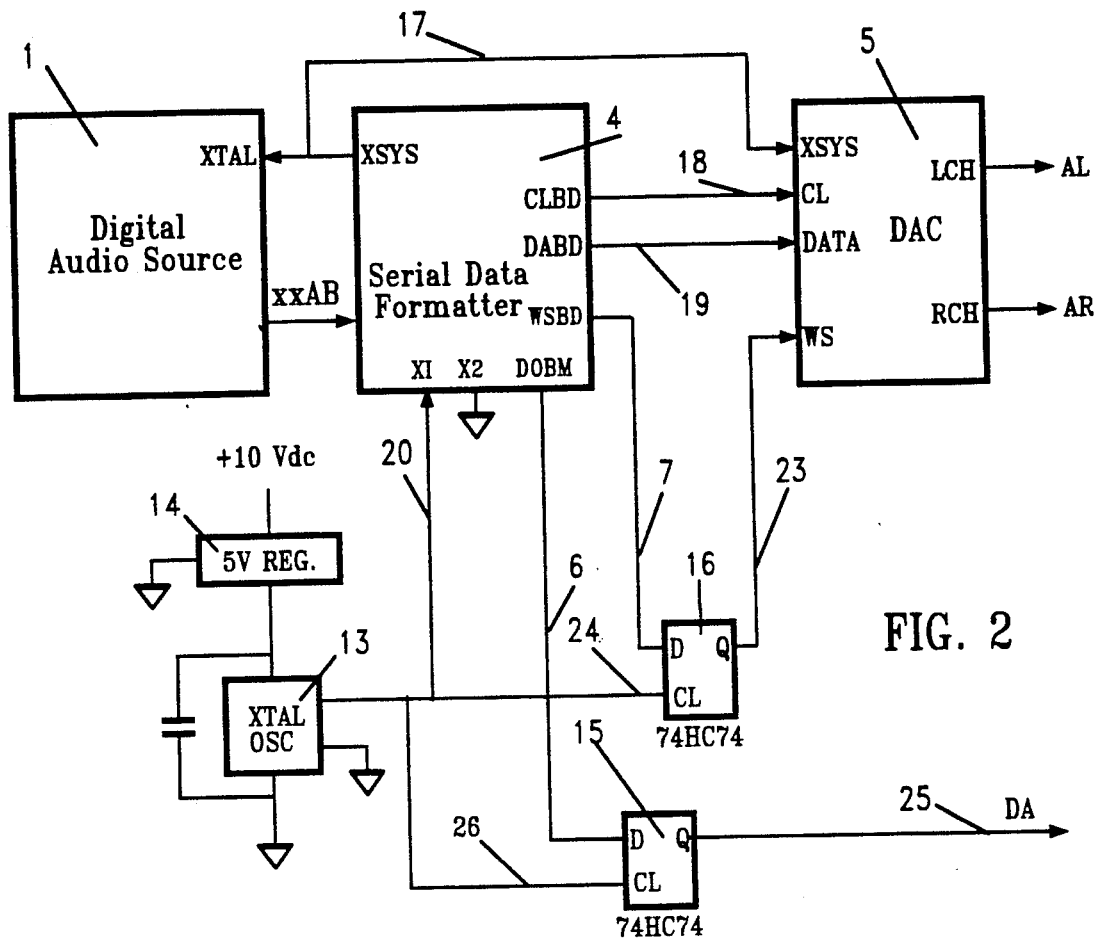
FIG. 2 is an extraction of FIG. 1 including additional circuitry for improved reproduction of audio from a digital audio source.

FIG. 2 is a schematic illustration of an arrangement of the present invention. To overcome the deficiencies the present invention includes an crystal controlled oscillator 13 and a regulated power supply 14 dedicated to oscillator 13. The output of oscillator 13 drives serial formatter 4 and two transfer buffers 15 and 16 via line 20, 24 and 26. Transfer buffer 16 receives the word select clock signal of data formatter 4 on line 7 and generates a re-synchronized word select signal the re-synchronized signal to DAC 5 on line 23. Serial data formatter 4 includes an output 'DOBM' which provides a serial digital audio signal in SPDIF or AES/EBU or equivalent format. Transfer buffer 15 receives the output DOBM 6 of formatter 4 and generates a re-synchronized serial digital audio signal DA on line 25. Transfer buffers 15 and 16 are of the type 74HC74, the oscillator is a type FOX F1100 with a frequency of 11.2896 MHz. As regulated +5 VDC supply 14 any single component or assembly can be used which satisfies the needs of the selected oscillator type for oscillator 13.

Figure 6:
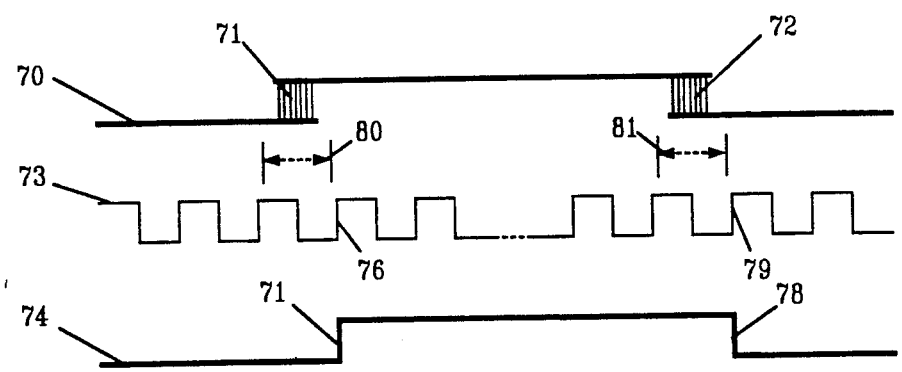
FIG. 6 is an illustration of the resynchronization of a word clock signal.

FIG. 6 is an ilustration of the resynchronization of a wordclock signal. A wordclock signal should have a defined length because it determines at what time a data word is entered into a register or the like. However, due to the discovered defiencies in the equipment leading and trailing edges of the wordclock signal do not occur at the expected times but within a time span including the expected time. In FIG. 7 the incoming wordclock signal 70 has a leading edge 71 and a trailing edge 72. Using system clock 73 which has a higher frequency than word clock 70 word clock 70 is resynchronized if the time span in which an edge may occur is smaller than the time period of the resynchronizing system clock. The resynchronized wordclock 74 has a defined period within the precision of the synchronizing clock. Leading edge 75 of resynchronized wordclock 74 is defined by rising edge 76 of synchronizing clock 73 if the corresponding leading edge 71 of wordclock 70 occurred during time span 80 of the recovery window. Trailing edge 78 of resynchronized wordclock 74 is defined by rising edge 79 of synchronizing clock 73 if the corresponding leading edge 72 of wordclock 70 occurred during time span 81 of the recovery window. In case of equipment using a data formatter of the type SAA7220 the system uses a 11.28 MHz system clock. This frequency translates into a theoretical recovery or jitter window of 1/11.28 or 88.6 nsec. However, in real life the acceptable jitter window has to be smaller due to switching times, rise and fall times of signals etc.

DESCRIPTION OF A SECOND PREFERRED EMBODIMENT

Figure 4:
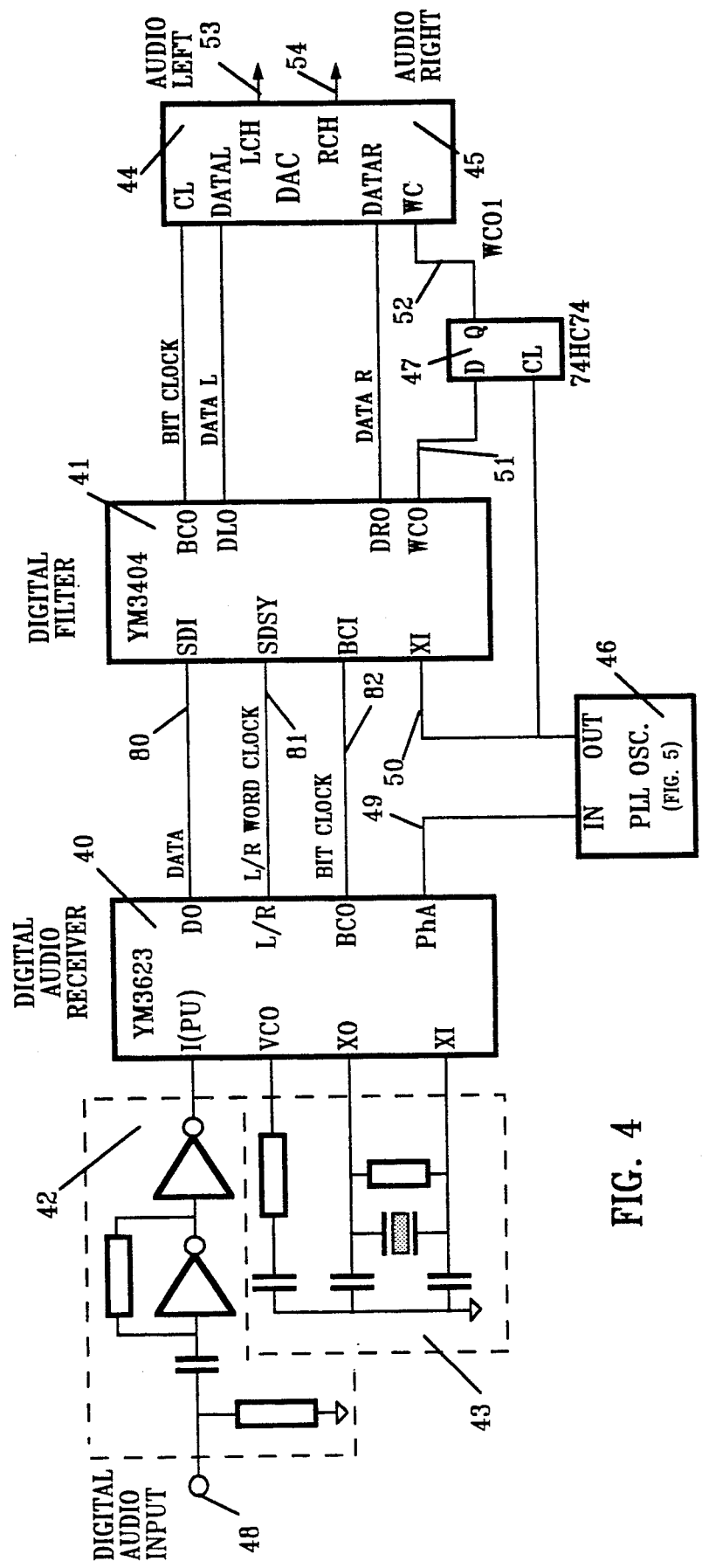
FIG. 4 is a schematic illustration of the interconnection of major components of a receiver for transmitted digital audio signals.

FIG. 4 is a schematic illustration of a receiver for digital audio signals. The schematic does not include components not essential for demonstrating the use of the present invention. The digital audio receiver of FIG. 4 receives signals at terminal 48. The source of the signal received at terminal 48 is external to the equipment which includes the circuitry shown in FIG. 4 and could be the digital audio signal output 25 of the equipment shown in FIG. 2. The received serial digital audio signal conforms with the digital audio interface signal format SPDIF or AES/EBU or equivalent for transferring digital audio signals between digital audio equipment.

Digital audio signals transmitted in AES/EBU format consists of serial blocks of data called frames. Each frame includes two sub-frames, one for each audio channel. A sub-frame starts with a 4-bit preamble, followed by 28 bits of audio data, auxiliary data, status data and a parity bit. All but the first four bits are fully biphase-mark encoded, that is the data representation includes the clock for handling the data. The preamble of each sub-frame contains two biphase-mark code violations, by which the preamble and the type of preamble can be detected. However, this code violation is one cause for jitters observed in the transfer of data, as will be demonstrated in more detail below.

Terminal 48 is connected to digital audio receiver 40 by an input circuit 42 which includes conventional line termination and signal buffers. Digital audio receiver 40 includes circuitry for recovering or regenerating the timing clocks of the digital audio signal received at terminal 48. This task is performed by a controlled oscillator of digital audio receiver 40 including a crystal and other components combined in arrangement 43 of FIG. 4. Input circuit 42 and circuit 43 are conventional and known to the person skilled in the art. Digital audio receiver 40 provides a digital audio data signal on line 80, an L/R channel word clock on line 81, a bit clock on line 82 and system clock on line 49. It is the system clock signal on line 49 which exhibits a dependency on the received data. One of the causes for jitter of the signals is to be found in the decoding of the format used to transmit digital audio signals. The format consists of sub code and digital audio encoded in form of a biphase-mark Manchester Code. For synchronization purposes preambles causing an intended code violation is used. Such a preamble includes code which never occurs in the data section of the format. The three preambles identify left channel data, right channel data and a block start identification. Each of these three preamble causes in the internal PLL of the receiver 40 a condition in which the PLL will be pulled from its lock condition and will freewheel through the time period of the preamble, typically 4 bits. This freewheeling operation causes a time shift of its VCO, which results in a jitter of all subsequent signals, including data signals on line 80, L/R Word Clock on line 81, bit clock on line 82 and system clock on line 49. Another source of jitter on the above signals is caused by the signals arriving at terminal 48 of FIG. 4. The input signal is Manchester encoded and results in a average signal level of 50% of the maximum signal level. However, due to rise and fall times of the binary signals the average will deviate from this value. All deviations are data dependent, which data are audio data, preamble data and subcode data. The Manchester code includes a scheme which allows to derive a clock which is related to the data encoded in the Manchester coded data stream. However, when applying manchester code to audio data transmission the rise and fall times, from which pulsed data streams are derived, any change in density of data causes a timing change which in turn is interpreted by the PLL and shows as an small but recognizable instantaneous frequency change. The occurrence of the instantaneous frequency shift shows up as a phase noise of jitter signal.

A phase locked loop oscillator 46 is used to regenerate a system clock and provide the new system clock on line 50 to digital Filter 41 and a buffer 47. The new system clock times operation of digital filter 41. However digital filter 41 receives also a signal L/R word clock via line 81 from receiver 40. This signal is fluctuating in a similar fashion as the system clock on line 49. Buffer 47 is a temporary storage for the word clock signal generated by digital filter 41 and provided on line 51. The new word clock signal WCO1 on line 52 controls digital to analog converters 44 and 45 of the left and right audio channel. Signal WCO1 is synchronized with the new system clock generated by oscillator 46, which acts as a low pass filter in the phase domain. The linear left and right channel output signals are provided on lines 53 and 54.

Figure 5:
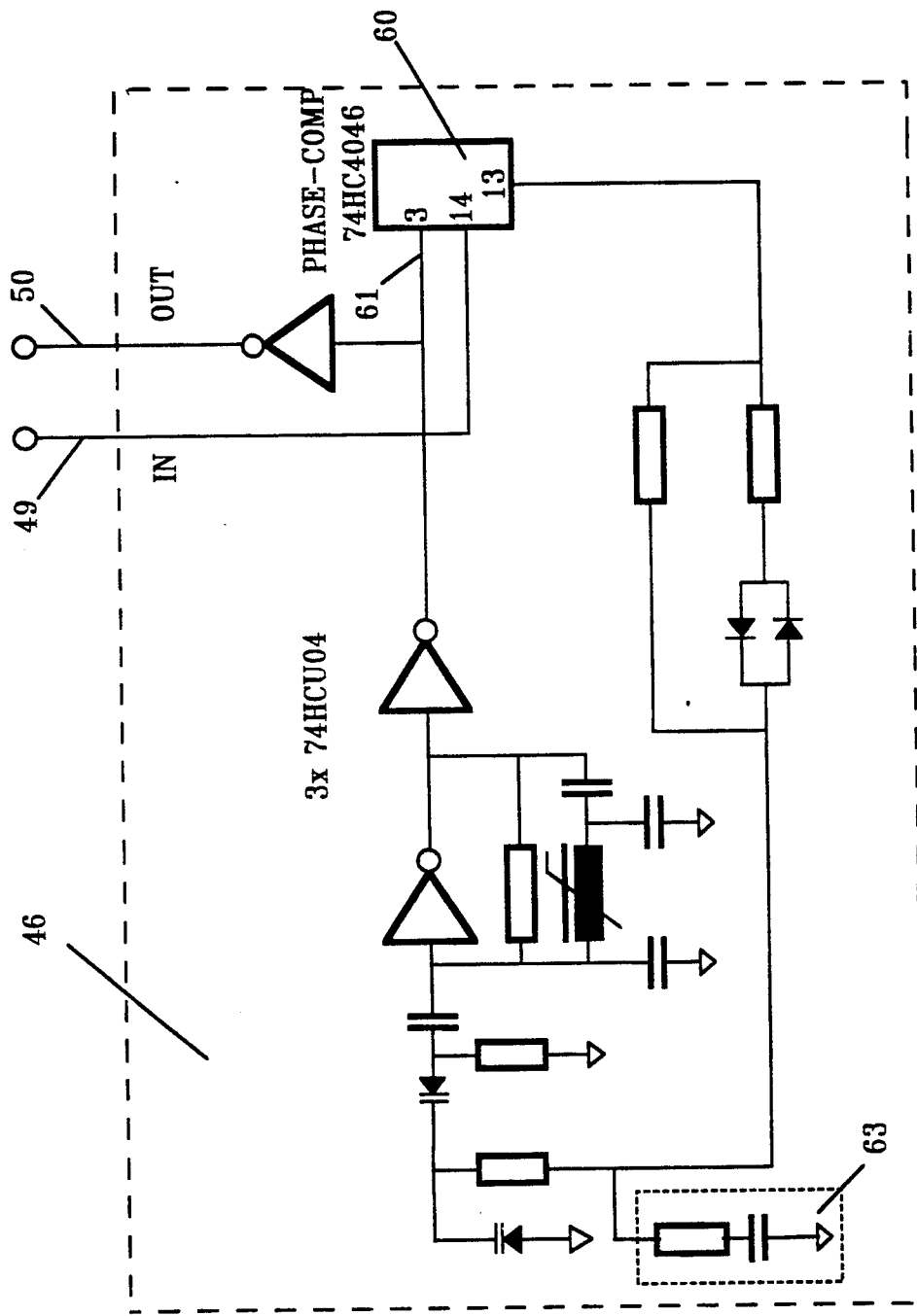
FIG. 5 is a schematic illustration of a phase-locked-loop oscillator used in the receiver of FIG. 4.

FIG. 5 is a schematic illustration of phase-locked-loop oscillator 46 of FIG. 4. This oscillator includes a loop filter 63 which give the oscillator a low pass filter characteristic. Otherwise the phase locked loop oscillator is of conventional design. In the preferred embodiment the phase comparator section 60 of an integrated phase locked loop oscillator of the type HC4046 is used. However, this component can easily be replaced with other phase comparators having the same characteristics.

The preferred embodiments of the present invention demonstrate the use and just two ways to overcome signal distortions caused by mechanical resonance effects, supply voltage modulations caused by data handling, inadequate supply voltage filtering and distributions on and off integrated circuits, and changes in the data clock frequency due to the used encoding scheme.

What I claim is:

1. In digital audio equipment including a digital audio signal source, digital audio signal processing means and a digital-to-analog converter, said digital audio signal source supplying a digital audio signal to said digital audio processing means, said digital audio processing means receiving a timing signal for processing said digital audio signal and providing a first word clock signal and a digital audio data signal, said digital audio data signal being forwarded to said digital-to-analog converter, said digital-to-analog converter having a first input for receiving said digital audio data signals and a second input for receiving a second word clock signal controlling the time when to accept said digital audio signal supplied to said first input, an ancillary circuit for synchronizing said digital audio data signals transmitted to said digital-to-analog converter under control of said second word clock signal, comprising an oscillator providing said timing signal to said digital audio signal source and said digital audio signal processing means;

a buffer storage having
an input for receiving said first word clock signal from said digital audio signal processing means,
an output connected to said second input of said digital-to-analog converter and providing said second word clock signal, and
a timing signal input connected to said oscillator and receiving said timing signal for controlling the time when to receive one of said first word clock signals,
said timing signal of said oscillator clocking said first word clock signal into said buffer storage, thereby generating said second word clock signal at the output of said buffer storage, said second word clock signal being synchronized with said timing signal.

2. In digital audio equipment including a digital audio signal source, digital audio signal processing means and a digital-to-analog converter, an ancillary circuit for synchronizing digital audio data signals transmitted to said digital-to-analog converter under control of a word clock, as claimed in claim 1 said ancillary circuit further including a power supply, dedicated to supply current to said oscillator and said buffer.

3. In digital audio equipment including a digital audio signal source, digital audio signal processing means and a digital-to-analog converter, an ancillary circuit for synchronizing digital audio data signals transmitted to said digital-to-analog converter under control of a word clock, as claimed in claim 1 said ancillary circuit further including a first power supply and a second power supply,
said first power supply being dedicated to supply current to said oscillator, said second power supply being dedicated to supply current to said buffer.

4. In digital audio equipment including a digital audio signal source, digital audio signal processing means and a serial digital audio output, said digital audio signal source supplying a digital audio signal to said digital audio processing means.

said digital audio processing means receiving a timing signal for processing said digital audio signal and providing a first serial digital audio data signal, an ancillary circuit for synchronizing said first serial digital audio data signal generated by said digital audio signal processing means and providing a second serial digital audio signal to said serial digital audio output, said first and second serial digital audio signals consisting of sequential data bits, said ancillary circuit comprising
a buffer storage for temporary storage of data bits of said first serial digital audio signal,
an oscillator providing said timing signal to said digital audio signal source and said digital audio signal processing means;
said buffer storage having
an input connected to said digital audio processing means for sequentially receiving said data bits of said first serial digital audio signal,
an output connected to said serial digital audio output for sequentially providing said data bits of said second serial digital audio signal, and
a timing signal input connected to said oscillator for receiving said timing signals controlling the time when to receive said data bits of said first serial digital audio signal,
said timing signal of said oscillator clocking said bits of said first serial digital audio signal into said buffer storage, thereby generating said data bits of said second serial digital audio signal at the output of said buffer storage, said second digital audio signal being synchronized with said timing signal.

5. In digital audio equipment including a digital audio signal source, digital audio signal processing means and a digital-to-analog converter, an ancillary circuit for synchronizing digital audio data signals transmitted to said digital audio signal output, as claimed in claim 4 said ancillary circuit further including a power supply, dedicated to supply current to said oscillator and said buffer.

6. In digital audio equipment including a digital audio signal source, digital audio signal processing means and a serial digital output, an ancillary circuit for synchronizing digital audio data signals transmitted to said digital audio output, as claimed in claim 4, said ancillary circuit further including a first power supply and a second power supply,
said first power supply being dedicated to supply current to said oscillator, said second power supply being dedicated to supply current to said buffer.

7. In digital audio equipment including an input for receiving digital audio input signals, digital audio signal processing means, and a digital-to-analog converter, said digital-to-analog converter having a first input for receiving a digital audio data signal and a second input for receiving a second word clock signal controlling the time when to accept said digital audio data signal supplied to said first input, said input receiving said digital audio input signals and providing a digital audio signal to said digital audio processing means, said digital audio processing means receiving a timing signal for processing said digital audio signal and providing a first word clock signal and said digital audio data signal, said digital audio data signal being forwarded to said first input of said digital-to-analog converter,
an ancillary circuit for synchronizing said digital audio data signal transmitted from said digital audio signal processing means to said digital-to-analog converter under control of said second word clock,
comprising
an oscillator, buffer storage for said first word clock, having an input for receiving said first clock, an output for providing said second word clock,
said oscillator providing said timing signal for operating said digital audio processing means, and said buffer storage for synchronizing said first word clock with said timing signal, thereby providing said second word clock;
said second word clock signal being used in said digital-to-analog converter for synchronizing said digital audio data signal supplied by said digital audio signal processing means.

8. In digital audio equipment including an input for receiving digital audio signals, digital audio signal processing means, and a digital-to-analog converter an ancillary circuit for synchronizing digital audio data signals transmitted to said digital-to-analog converter under control of said second word clock, as claimed in claim 7,
said ancillary circuit further comprising
a power supply dedicated to said oscillator and said buffer storage.

9. In digital audio equipment including an input for receiving digital audio signals, digital audio signal processing means, and a digital-to-analog converter
an ancillary circuit for synchronizing digital audio data signals transmitted to said digital-to-analog converter under control of said second word clock, as claimed in claims 7 or 8, wherein said oscillator is a phase locked loop oscillator synchronized to a frequency derived from said received digital audio signal.

10. In digital audio equipment including an input for receiving digital audio signals, digital audio signal processing means, and a digital-to-analog converter
an ancillary circuit for synchronizing digital audio data signals transmitted to said digital-to-analog converter under control of a word clock, as claimed in claim 9, wherein said phase locked loop oscillator has a low pass filter characteristic.

11. In digital audio equipment including a digital audio signal source, digital audio signal processing means and a digital-to-analog converter,
said digital audio signal source supplying a digital audio signal to said digital audio processing means,
said digital audio processing means receiving a timing signal for processing said digital audio signal and providing a first word clock signal and a digital audio data signal, said digital audio data signal being forwarded to said digital-to-analog converter,
said digital-to-analog converter having a first input for receiving said digital audio data signal and a second input for receiving a second word clock signal controlling the time when to accept said digital audio data signal supplied to said first input,
an ancillary circuit for synchronizing said digital audio data signal transmitted to said digital-to-analog converter under control of a second word clock,
comprising
an oscillator,
buffer storage for said first word clock having an input for receiving said first clock, an output for providing said second word clock, and
a power supply dedicated to said oscillator; said oscillator providing said timing signal for operating said digital audio signal processing means and said buffer storage for synchronizing said first word clock, thereby providing said second word clock;
said second word clock signal being used in said digital-to-analog converter for synchronizing said digital audio data signal supplied by said digital audio signal processing means.

* * * * *